United States Patent [19]
Miller et al.

[11] Patent Number: 6,057,571
[45] Date of Patent: May 2, 2000

[54] HIGH ASPECT RATIO, METAL-TO-METAL, LINEAR CAPACITOR FOR AN INTEGRATED CIRCUIT

[75] Inventors: Gayle W. Miller; Kenneth P. Fuchs, both of Colorado Springs, Colo.

[73] Assignee: LSI Logic Corporation, Milpitas, Calif.

[21] Appl. No.: 09/052,851

[22] Filed: Mar. 31, 1998

[51] Int. Cl.[7] ............................. H01L 29/78; H01L 33/00
[52] U.S. Cl. .......................................... 257/296; 257/303
[58] Field of Search ...................................... 297/296, 303

[56] References Cited

U.S. PATENT DOCUMENTS

| | | | |
|---|---|---|---|
| 5,095,346 | 3/1992 | Bae et al. ............................ | 357/23.6 |
| 5,101,251 | 3/1992 | Wakamiya et al. . | |
| 5,273,925 | 12/1993 | Yamanaka .............................. | 437/52 |
| 5,381,365 | 1/1995 | Ajika et al. .......................... | 365/149 |
| 5,394,000 | 2/1995 | Ellul et al. ............................ | 257/301 |
| 5,434,812 | 7/1995 | Tseng .................................. | 365/149 |
| 5,494,854 | 2/1996 | Jain ..................................... | 437/195 |
| 5,494,857 | 2/1996 | Cooperman et al. .................. | 437/228 |
| 5,767,541 | 6/1998 | Hanagasaki . | |

Primary Examiner—Stephen D. Meier

[57] ABSTRACT

A linear capacitor formed in an IC which has horizontally oriented interconnect layers that are vertically separated by dielectric material. Two separated metal plates of the capacitor are electrically connected to the conductors of different vertically-separated metal interconnect layers. The metal plates extend substantially vertically through the thicker dielectric material separating the interconnect layers, to provide a relatively high capacitance per unit of surface consumed. The interconnect layers to which the plates are connected are separated from a substrate of the IC by at least one layer of dielectric, to reduce parasitic effects. Forming the capacitor plates and the interconnect layers from at least some of the same metals simplifies construction and reduces cost, while providing linear response characteristics. Placing the capacitor between the interconnect layers avoids consuming space on the substrate to construct the capacitor.

18 Claims, 1 Drawing Sheet

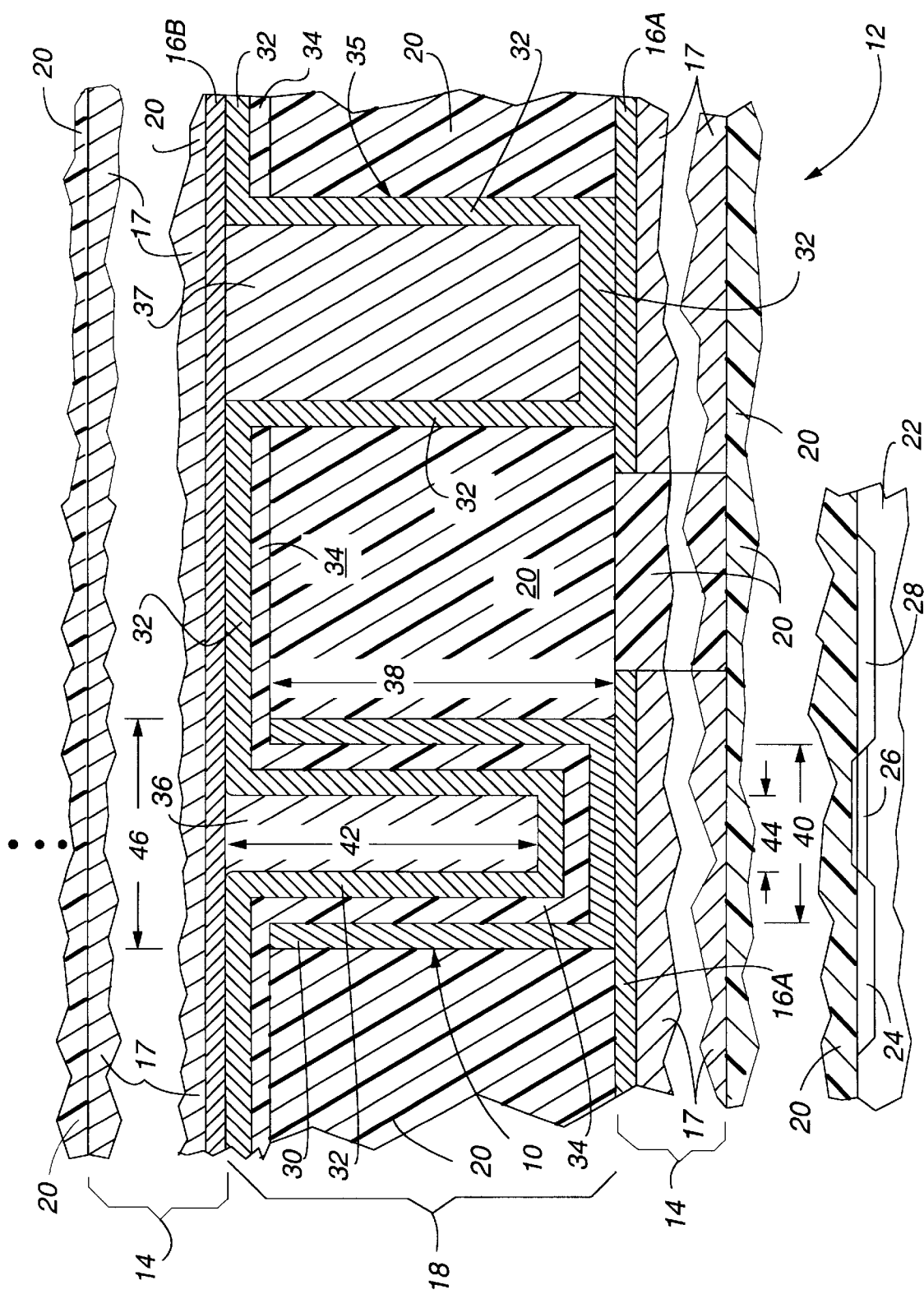

HIGH ASPECT RATIO, METAL-TO-METAL, LINEAR CAPACITOR FOR AN INTEGRATED CIRCUIT

This invention relates to integrated circuits (ICs) having multiple layers of metal interconnects, also referred to as metal layers or more simply as "metal." More particularly, the present invention relates to a new and improved capacitor for such ICs wherein the capacitor has a relatively high aspect ratio, a relatively large value of capacitance relative to the surface area it consumes, and linear signal response characteristics.

CROSS-REFERENCE TO RELATED INVENTION

This invention is related to an invention for a "Method of Electrically Connecting and Isolating Components with Vertical Elements Extending Between Interconnect Layers in an Integrated Circuit," described in a concurrently filed U.S. patent application Ser. No. 09/052,793 which is assigned to the assignee hereof. The subject matter of this concurrently filed application is incorporated herein by this reference.

BACKGROUND OF THE INVENTION

Capacitors are commonly employed in digital and memory ICs for a variety of purposes, such as to store electrical charge, to block DC voltage levels, and to stabilize power supplies. In memory ICs, for example dynamic random access memories (DRAMs), a capacitor is used to hold enough charge to represent a detectable logic state.

Polysilicon is typically used to construct the plates of the capacitor. Polysilicon is not necessarily the optimum material to form the capacitor plates, because its doping characteristics result in variable capacitance in the polysilicon plate-polysilicon plate capacitor. In polysilicon capacitors the value of capacitance varies relative to the voltage level applied to the capacitor. The resistance of the polysilicon tends to be dependent on, and therefore a function of, the level of voltage applied to the polysilicon. Polysilicon capacitors are also frequently located in positions in the IC where the surrounding IC components degrade the performance of the capacitor. For example, locating the capacitor on the substrate increases the parasitic effect on the capacitor, further degrading its performance.

Despite these effects, the variance in capacitance is not of primary concern in memory ICs because the capacitor is required to accept charge, to hold some or all of the charge for a time period and then discharge, all in a reliable manner. Furthermore, since polysilicon is also used to fabricate other components of the IC, such as transistors and conductors, the plates of the capacitors can be formed simultaneously with the other components of the IC, thus simplifying the construction process and reducing fabrication costs.

In analog circuit applications, on the other hand, capacitors are frequently used as impedance elements whose response characteristic must be linear. If the impedance of the capacitor is not fixed and reliably ascertainable, the response of the capacitor will vary non-linearly. As a result, the performance of the analog circuit may be unsatisfactory.

The recent development of system level integrated circuits (SLICs) and application specific integrated circuits (ASICs) have combined linear or analog circuitry and digital circuitry on the same IC. In such applications, linear capacitors have become somewhat problematic. Polysilicon is not a desirable material from which to form linear capacitors because of its non-linear response characteristics. The fabrication technology for memory capacitors is not generally applicable for fabricating capacitors that may be required to serve as both digital components and analog components.

Capacitors also affect the cost of the IC. In general, the cost of the IC is directly related to the size or surface area of the substrate upon which the IC is constructed. If the IC components require a large amount of space, a larger substrate is required, and the IC cost increases.

The ongoing evolution of miniaturizing ICs has resulted in reduced costs and more circuit functionality for a given substrate size and manufacturing cost. For example, only a few years ago spacing between adjoining circuit elements in a typical IC was in the neighborhood of two to three microns. Today, many ICs are being designed at spacing distances as small as 0.35 microns or less. To accommodate narrower spacing, the electrical conductors are reduced in width. The reduction in width is compensated for by increasing the thickness of the conductors to avoid degrading the quality of the signal conducted. Metal conductors have also been substituted for polysilicon conductors, because the metal conductors provide better signal conducting capabilities.

Increasing the thickness of the conductors also requires increases in the thickness of the dielectric insulation material which separates and covers the conductors and components. The thickness of the dielectric must be greater than the height or topology difference among the components, to provide adequate insulation to separate the layers and components of the IC structure from one another. Increases in the thickness of the dielectric material are possible, in part, as a result of advanced planarization techniques such as chemical mechanical polishing (CMP). CMP smooths relatively significant variations in the height of the different components to a planar surface. Smoothing the variable-height topology to a planar surface allows the typical lithographic semiconductor fabrication techniques to be used to form considerably more layers than were previously possible in IC construction. Previously, only one or two layers were typically constructed before the topology variations created such significant depth of focus problems with lithographic processes that any further precision fabrication of layered elements was prevented. However, because of CMP, the number of layers of the IC is no longer limited by the topology. Some present ICs are formed by as many as five or more separate metal or interconnect layers, each of which is separated by a CMP planarized dielectric layer. Consequently, CMP has created the opportunity to incorporate more circuitry on a single substrate in a single IC.

It is with regard to these and other considerations that the present invention has evolved.

SUMMARY OF THE INVENTION

One of the improvements of the present invention relates to a capacitor for an IC which is formed between multiple metal interconnect layers and which has signal response characteristics that make it suitable for both analog and digital circuit applications. Another improvement relates to positioning the capacitor between the interconnect layers in a space-effective manner to obtain a relatively large value of capacitance when consuming a minimum of surface area. Another improvement relates to positioning the capacitor in the IC at a location where substrate space is not consumed by the capacitor and where the capacitor is shielded from the parasitic effects of the substrate.

These and other improvements are obtained from a capacitor which is formed between two interconnect layers that are vertically separated from one another by dielectric material. In one regard, the capacitor comprises two separated metal plates each of which is electrically connected to a different adjacent metal interconnect layer. In another regard, the capacitor comprises two separated metal plates which extend substantially vertically between the adjacent metal interconnect layers. In still another regard, the capacitor comprises two separated plates each of which is electrically connected to a different adjacent interconnect layer, and the interconnect layers to which the plates are connected are separated from the substrate by at least one layer of dielectric.

The plates are preferably formed of metal, at least some of which is the same metal from which conductors of the interconnect layers are formed. The metal plates provide linear response characteristics which make the capacitor suitable for analog circuit applications as well as digital circuit applications. Forming the capacitor plates from the same material as the interconnect layers simplifies construction and reduces cost. The vertical orientation of the plates between the interconnect layers substantially reduces the space consumed by the capacitor, thereby providing higher capacitance per unit of surface area. The position of the capacitor in the dielectric material between the interconnect layers makes advantageous use of the thicker dielectric associated with multi-layer IC structures, thereby increasing the component density in the IC. Separating the capacitor from the substrate by at least one interconnect layer and/or the dielectric adjacent to that interconnect layer isolates the capacitor from the parasitic effects induced by the substrate. The vertical orientation of the plates with the inter-layer dielectric surrounding the plates also reduces the parasitic capacitance to the substrate.

A more complete appreciation of the present invention and its scope may be obtained by reference to the accompanying single Figure drawing, which is briefly summarized below, and to the following detailed description of presently preferred embodiments of the invention, and to the appended claims.

BRIEF DESCRIPTION OF THE DRAWING

The single FIGURE is a cross-sectional view of a capacitor embodying the present invention, shown positioned in an IC having multiple interconnect layers connected by a via and constructed on a substrate, with portions broken out for clarity.

DETAILED DESCRIPTION

A capacitor 10 which embodies the present invention is incorporated in an integrated circuit (IC) 12 such as is shown. The IC 12 is of the type having multiple layers 14 of electrical conductors known as interconnects. The electrical conductors of each interconnect layer 14 extend between and connect to the other functional components (not shown) of the IC 12. The electrical conductors of the interconnect layers 14 are preferably formed of separate layers of metal, as represented by the layers 16A, 16B and 17 shown. Each interconnect layer 14 is separated by a relatively thick layer 18 of dielectric material 20. The dielectric material 20 of each layer 18 electrically insulates the interconnect layers 14 from one another and electrically insulates the other components within the IC from one another. Because of the relative thickness of each dielectric layer 18, space exists between interconnect layers 14 to accommodate the capacitor 10 and to allow it to be connected to the conductors of the interconnect layers 14.

The multiple interconnect layers 14 and the dielectric layers 18 are built or layered above a substrate 22 of the IC. The substrate 22 serves as the foundation for the IC and its functional components formed in and on the substrate 22. The functional components of the substrate 22 are illustrated by a transistor having source, channel and drain regions 24, 26 and 28, respectively. The ability to fabricate ICs with multiple interconnect layers 14 has been made possible by the present advanced state of planarization processes, for example chemical mechanical polishing (CMP). The capacitor 10 is preferably fabricated according to the techniques described in the previously mentioned patent application and as described herein.

The capacitor 10 is formed by two capacitor plates 30 and 32 which are separated by a capacitor dielectric material 34. Preferably the plates 30 and 32 are formed of metal, such as titanium or titanium nitride, for example. The metal of the plates 30 and 32 is preferably of the same type of metal from which the layers 16A and 16B of the electrical conductors of the interconnect layers 14 are formed. Forming the plates 30 and 32 from the same metal as the conductor layers 16A and 16B allows the capacitor plates 30 and 32 to be formed compatibly with the conductors of the interconnect layers 14. The metal plates of the capacitor 10 causes it to exhibit a linear response characteristic to electrical signals, thereby making the capacitor 10 suitable for use as an analog circuit element or as a digital circuit element.

The conductors of the interconnect layers 14 are preferably formed in distinct layers, for example layers 16A, 16B and 17 as shown. The layers 16A and 16B are preferably is formed from titanium nitride or titanium and titanium nitride. The layer 17 may be formed from copper or aluminum or a combination of both, for example aluminum with approximately 0.5% copper. If the layer 17 is formed of primarily aluminum, an anti reflection coating (ARC) 16A is applied in the conventional manner to the aluminum to prevent light reflection into undesired locations within the photoresist material which is typically applied during photolithographic semiconductor fabrication processes. Further still, if the layer 17 is formed of primarily copper, the copper is typically coated with an encapsulating layer 16A to prevent the copper ions from migrating beyond the borders of the layer, as is conventional.

The lower plate 30 of the capacitor 10 is preferably directly electrically connected to the layer 16A of the lower interconnect layer 14, as shown. Similarly, the upper plate 32 is directly connected to the conductor 16B of the upper interconnect layer 14, as shown. The electrical connection is preferably formed, in both cases, by the direct physical and electrical contact and interface of the conductor layers 16A and 16B with the plates 30 and 32, respectively. This direct interface is preferably established by depositing or forming the plate 30 on the conductor layer 16A, or by depositing conductor layer 16B directly on the plate 32. The conductor layer 16A of the interconnect layer 14 below the capacitor 10 is now covered, preferably by chemical vapor deposition with a layer 18 of dielectric material 20. A slot or hole is then formed or etched in the dielectric material 20 using a conventional photolithography step. This provides a surface with vertically extending surfaces upon which to deposit the plate 30 as shown.

The dielectric material 34 of the capacitor 10 is selected to provide the desired dielectric characteristics, and may be the same as the dielectric material 20. Alternatively, the capacitor dielectric material 34 may be a different type of dielectric material which is deposited after forming the lower plate 30 and before the upper plate 32 is formed. The capacitor dielectric material 34 completely separates each capacitor plate from the other capacitor plate. In addition, the capacitor dielectric material 34 is deposited on the top surface of the dielectric layer material 20 extending laterally outward from the top ends of the capacitor plate 30, as shown.

After depositing the capacitor dielectric material 34, any vias 35 between the conductors of different interconnect layers 14 are formed. Vias are through-hole electrical connections between the conductors 16A and 16B of the vertically separated interconnect layers 14. Each via 35 is formed in a hole formed through the dielectric materials 34 and 20. The hole for the via 35 is cut in the dielectric material 34 and 20 by conventional semiconductor fabrication lithography techniques. The hole for the via 35 exposes the conductor layer 16A to which an electrical connection is to be made at the bottom or lower vertical end of the via.

After the hole for the via is formed through the dielectric materials 34 and 20, the layer of metal forming the upper capacitor plate 32 is deposited on the dielectric material 34 and on the side walls of the hole for the via 35. Thus, the layer of metal simultaneously forms the upper capacitor plate 32 and a liner layer for the through-hole electrical connection of the via 35.

It is common practice to fill the center opening of the via 35 with a plug 37 formed from deposited metal such as tungsten. Simultaneously, because a center opening also exists within the capacitor 10 as defined by the U-shape of the upper capacitor plate 32, the deposition of the metal in the center opening of the via 35 also fills all or part of the center opening of the capacitor 10, depending upon the size of the capacitor 10. A capacitor plug 36 is thereby formed simultaneously with the formation of the via plug 37.

Next, the upper surfaces of the capacitor plug 36 and the via plug 37, and the upper horizontal surfaces of the metal 32 are made co-planar. The upper surfaces of the plugs 36 and 37 may be planarized off by using an etch back process. If CMP is used to planarize the top surfaces of the plugs 36 and 37 and the metal 32, a CMP process with high selectivity favoring removal of tungsten but leaving dielectric material should be used. With the upper surfaces of the plugs 36 and 37, the capacitor 10, the via 35, and the metal material 32 extending between the capacitor 10 and the via 35 all co-planarized, the conductor layer 16B of the next-above interconnect layer 14 is deposited on top of and in contact with these planarized structures. The layer 16B, or its functional equivalent, is additionally employed as a "glue" layer to assure a good mechanical connection to the component to which it is attached. The use of "glue" layers is well known in semiconductor fabrication processes. Thereafter, the additional layer 17 of the upper interconnect layer 14 (as shown) is formed on the top surface of the layer 16B.

The relative thickness of the dielectric layers 18 between the interconnect layers 14 allows the majority portions of the plates 30 and 32 to be oriented in a vertical configuration as shown. The vertical orientation need not be precisely perpendicular to the interconnect layers 14, but it is sufficient that the plates 30 and 32 extend more vertically than horizontally. The vertical majority portion of the lower plate 30 is represented by approximately twice the dimension 38, since the U-shaped lower plate 30 has two vertical portions. The horizontal minority portion of the plate 30 extends along the dimension 40 at the lower interconnect layer 14. The horizontal minority portion is therefore considerably smaller than the vertical majority portion of the plate 30.

Similarly, the vertical majority portion of the upper plate 32 is considerably greater in size than its horizontal minority portion. The vertical majority portion of plate 32 is represented by approximately twice the dimension 42, while the horizontal minority portion of the plate 32 is represented by the dimension 44, for the same reasons as explained above. As shown, the upper plate 32 may be physically somewhat smaller in size than the lower plate 30, but the capacitance value of the capacitor 10 is related to the effective surface area of the smaller plate.

Each of the plates 30 and 32 and the capacitor dielectric 34 are shown as generally U-shaped in the two-dimensional view illustrated. In the third dimension extending perpendicularly from the horizontal and vertical dimensions shown, the capacitor plates extend longitudinally for a predetermined distance. In this elongated configuration, the capacitor 10 is formed in a slot which has been etched or otherwise formed in the dielectric material 20. The length of the slot (orthogonal to the plane of the Figure drawing) contributes to the value of the capacitance by increasing the surface area of the plates. Additional increases in capacitance may be obtained by replicating the structure of the capacitor 10 on a side-by-side basis in the dielectric layer 18.

In another configuration, the capacitor 10 is substantially cylindrical in shape. The plates 30 and 32, and the capacitor dielectric material 34, are formed as cylinders, with the co-located axes of the cylindrical shapes extending vertically between the interconnect layers 14.

Cylindrically-shaped capacitors have been employed previously in DRAMs. Trench capacitors, formed in a groove or trench, have also been employed in DRAMs, although the cylindrical shape is more common. Both cylindrically-shaped and trench-shaped capacitors are recognized as providing more capacitance value per unit of horizontal surface area than can be obtained by horizontal plate capacitors (not shown). Horizontal plate capacitors have their plates oriented horizontally and generally parallel to the horizontal surface of the substrate 22. Cylindrically-shaped and trench-shaped capacitors have been formed from polysilicon material. As such, these capacitors fail to obtain the linearity of response necessary for analog circuits.

As noted, the capacitor 10 is preferably located between two interconnect layers 14 in the dielectric layer 18 which separates the interconnect layers 14. Preferably, the capacitor is also separated from the substrate 22 by at least one layer 18 of dielectric material 20. The separation from the substrate by the dielectric layer 18 creates a substantial barrier to parasitic capacitance effects. Further still, the vertical orientation of the majority portions of the plates 30 and 32 leaves a relatively small surface area of the capacitor plates facing the substrate 22. The relatively small facing portion of the capacitor plates further reduces the parasitic capacitance effect. When an additional interconnect layer 14 is interposed between the capacitor and the substrate 22, a potential reference plane is created by the interconnect layer which further reduces the parasitic capacitive effect. As a result of these features, all related to the placement of the capacitor 10 within the layers of the IC, the capacitor 10 achieves substantially linear response characteristics, making it suitable as an analog or digital circuit element.

The placement of the capacitor 10 takes advantage of the relatively thick dielectric layer 18 between the interconnect layers 14. Use of the space in this manner allows additional circuit elements to be incorporated in the IC by consuming little additional space due to the substantial vertical orientation of the plates. As is shown, the total horizontal surface area consumed by the capacitor 10 is related to dimension 46, and that dimension is substantially smaller than the distance between adjacent interconnect layers 14. The small width of the capacitor compared to its height creates a high aspect ratio. Since the capacitance of the capacitor 10 is directly related to its plate surface area, and because the plate surface area is slightly larger than twice the dimension 38 or 42, a relatively large capacity (e.g., represented by at least twice the dimensions 38 or 42) is obtained compared to the horizontal surface area consumed. Thus, a capability to achieve relatively high capacitance values from relatively small amounts of consumed surface area is another advantage of the capacitor 10, making it capable of high density integration within the IC. Furthermore by fabricating the capacitor 10 in the dielectric layer 18 between the interconnect layers 14, valuable substrate space is not consumed, leaving more space upon which to fabricate additional IC components.

In summary, the vertical orientation of the plates causes the capacitor of the present invention to have a relatively high aspect ratio. The amount of capacitance available is increased, and a reduction in parasitic effects is also achieved. The location of the capacitor between the interconnect layers effectively uses the space and volume within the IC, without consuming extra amounts of valuable substrate surface area. The plates of the capacitor are formed in conjunction with the metal connectors of the interconnect layers, and the metal plates of the capacitor provide a desirable linear response and low voltage coefficient of capacitance. Many other important improvements are also available.

Presently preferred embodiments of the invention and their improvements have been described with a degree of particularity. These descriptions have been made as preferred examples. It should be understood that the scope of the present invention is defined by the following claims, and should not necessarily be limited by the detailed description of the preferred embodiments set forth above.

The invention claimed is:

1. A capacitor in an IC having functional components on a substrate, the IC having a plurality of horizontally oriented metal interconnect layers and a plurality of horizontally extending layers of dielectric material, a first lower interconnect layer separated from the substrate by a first lowermost layer of dielectric material, the first layer of dielectric material having an upper planarized surface upon which the first interconnect layer is formed, a second interconnect layer adjacent to and separated from the first interconnect layer by a second layer of dielectric material, the second layer of dielectric material having an upper planarized surface upon which the second interconnect layer is formed, said capacitor comprising two separated metal plates oriented within the second layer of dielectric material with the majority of each plate extending substantially vertically between the first and second interconnect layers, one of the plates electrically connected to the first interconnect layer and the other of the plates electrically connected to the second interconnect layer.

2. A capacitor as defined in claim 1 wherein the plates are formed of at least some of the metal from which the interconnect layers are formed.

3. A capacitor as defined in claim 1 wherein the plates directly contact the interconnect layers to which the plates are connected.

4. A capacitor as defined in claim 1 in combination with a second capacitor in the IC in addition to the capacitor first aforesaid, wherein the IC further includes a third interconnect layer which is adjacent to and vertically separated from the second interconnect layer by a third layer of dielectric material, the third layer of dielectric material having an upper planarized surface upon which the third interconnect layer is formed, said second capacitor comprising two separated metal plates oriented within the third layer of dielectric material with the majority of both plates extending substantially vertically between the second and third interconnect layers, one of the plates of the second capacitor electrically connected to the second interconnect layer and the other of the plates of the second capacitor electrically connected to the third interconnect layer.

5. A capacitor as defined in claim 1 in combination with a second capacitor in the IC in addition to the capacitor first aforesaid, wherein the IC further includes a third interconnect layer which is vertically separated from the second interconnect layer by a third layer of dielectric material, the additional layer of dielectric material having an upper planarized surface upon which the third interconnect layer is formed, a fourth interconnect layer adjacent to and separated from the third interconnect layer by a fourth layer of dielectric material, the fourth layer of dielectric material having an upper planarized surface upon which the fourth interconnect layer is formed, said second capacitor comprising two separated metal plates oriented within the fourth layer of dielectric material with the majority of both plates extending substantially vertically between the third and fourth interconnect layers, one of the plates of the second capacitor electrically connected to the third interconnect layer and the other of the plates of the second capacitor electrically connected to the fourth interconnect layer.

6. A capacitor as defined in claim 1 wherein the two separated metal plates of said capacitor are formed as upper and lower U-shaped metal plates separated by a U-shaped dielectric layer, the upper capacitor plate directly contacting the second interconnect layer, the lower plate directly contacting the first interconnect layer, and the upper end of the lower plate being flush with the upper planarized surface of the second layer of dielectric material.

7. A capacitor as described in claim 6, further comprising a metal via positioned within the second layer of dielectric material, the via comprising a U-shaped metal plate, the U-shaped metal plate of the via and the U-shaped upper plate of the capacitor being electrically connected.

8. A capacitor as described in claim 7, wherein the U-shaped metal plate of the via and the U-shaped upper plate of the capacitor are filled with a metal plug material.

9. A capacitor as described in claim 8, wherein a lower portion of the U-shaped metal plate of the via is in direct electrical contact with a metal interconnect layer.

10. A capacitor as described in claim 9, wherein the U-shaped metal plate of the via and the U-shaped upper plate of the capacitor are formed of at least some of the same type of metal as the interconnect layer to which the U-shaped metal plate of the via and the U-shaped upper plate of the capacitor are connected.

11. A capacitor comprising two separated metal plates which extend substantially vertically and electrically connect between horizontally adjacent metal interconnect layers of an IC having a substrate, wherein one plate is directly connected to an interconnect layer above the capacitor and the other plate is directly connected to an interconnect layer below the capacitor, and wherein the lower interconnect layer is vertically separated from the substrate by a planarized layer of dielectric material.

12. A capacitor as defined in claim 11 wherein the plates are formed of at least some of the metal from which the metal interconnect layers are formed.

13. A capacitor as defined in claim 11 wherein:

the interconnect layers are separated by a layer of dielectric material; and a substantial majority of a surface area of the plates is adjacent to the layer of dielectric material which separates the interconnect layers.

14. A capacitor as defined in claim 11 wherein a horizontal surface area occupied by the capacitor at either interconnect layer is substantially less than a vertical surface area occupied by the plates extending between the interconnect layers.

15. A capacitor as defined in claim 11 wherein the interconnect layers between which the capacitor are located are separated from a substrate of the IC by at least one layer of dielectric material in addition to the layer of planarized dielectric material first aforesaid which separates the substrate from the lower interconnect layer.

16. A capacitor as defined in claim 11 wherein:

the interconnect layers are separated by a layer of dielectric material, the plates are oriented substantially vertically in a slot formed in the layer of dielectric material which separates the interconnect layers, and the slot extends between interconnect layers.

17. A capacitor as defined in claim 11 wherein the plates are cylindrically shaped about an axis which extends vertically between interconnect layers.

18. A capacitor in an IC having functional components on a substrate, the IC having a plurality of horizontally oriented metal interconnect layers and a plurality of horizontally extending layers of dielectric material, a first interconnect layer separated from the substrate by a first layer of dielectric material, the first layer of dielectric material having an upper planarized surface upon which the first interconnect layer is formed, a second interconnect layer adjacent to and separated from the first interconnect layer by a second layer of dielectric material, the second layer of dielectric material having an upper planarized surface upon which the second interconnect layer is formed, a third interconnect layer adjacent to and separated from the second interconnect layer by a third layer of dielectric material, the third layer of dielectric material having an upper planarized surface upon which the third interconnect layer is formed, said capacitor comprising two separated metal plates oriented within the third layer of dielectric material with the majority of each plate extending substantially vertically between the second and third interconnect layers, one of the plates electrically connected to the second interconnect layer and the other of the plates electrically connected to the third interconnect layer.

* * * * *